United States Patent
Ushiroda et al.

(10) Patent No.: US 7,214,989 B2
(45) Date of Patent: May 8, 2007

(54) SEMICONDUCTOR DEVICE AND SEMICONDUCTOR INTEGRATED CIRCUIT DEVICE

(75) Inventors: Masaru Ushiroda, Kanagawa (JP); Hiroshi Furuta, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 169 days.

(21) Appl. No.: 10/975,956

(22) Filed: Oct. 29, 2004

(65) Prior Publication Data
US 2005/0098835 A1    May 12, 2005

(30) Foreign Application Priority Data
Nov. 6, 2003    (JP)    ............... 2003-376664

(51) Int. Cl.
*H01L 29/94*    (2006.01)
(52) U.S. Cl. ...................... 257/369; 257/371
(58) Field of Classification Search ................ 257/369, 257/371
See application file for complete search history.

(56) References Cited

U.S. PATENT DOCUMENTS

| | | | | |
|---|---|---|---|---|
| 5,581,103 A | * | 12/1996 | Mizukami | ................... 257/355 |
| 5,994,755 A | * | 11/1999 | DeJong et al. | ............... 257/500 |
| 6,472,715 B1 | | 10/2002 | Liu et al. | |
| 6,664,608 B1 | * | 12/2003 | Burr | ........................... 257/549 |
| 6,864,525 B2 | * | 3/2005 | Kaneko et al. | ............. 257/299 |
| 6,881,997 B2 | * | 4/2005 | Kaneko et al. | ............. 257/299 |
| 2004/0245577 A1 | * | 12/2004 | Bhattacharyya | ............. 257/369 |
| 2005/0167756 A1 | * | 8/2005 | Lotfi et al. | ................... 257/369 |

FOREIGN PATENT DOCUMENTS

| | | |
|---|---|---|
| JP | 10-70250 | 3/1998 |
| JP | 2001-291779 | 10/2001 |
| JP | 2003-60071 | 2/2003 |

* cited by examiner

*Primary Examiner*—Douglas W. Owens
(74) *Attorney, Agent, or Firm*—McGinn IP Law Group, PLLC

(57) ABSTRACT

Soft-error resistance and latch up resistance are simultaneously improved for LSI involving miniaturization and reducing operating voltage. P wells and N wells are formed in a higher density substrate (P on P+ substrate), and buried N wells are formed on a layer underlying thereof. A PMOSFET is formed in the N well and a NMOSFET is formed in the P well. A P well electric potential junction for coupling P well electric potential of the P well to predetermined electric potential is provided, and a region directly under the P well electric potential junction is provided with a region where the aforementioned buried N well is not disposed. The soft-error resistance is improved by having the buried N well therein, and the latch up resistance is improved by coupling the P well to the substrate.

19 Claims, 8 Drawing Sheets

PRIOR ART

PRIOR ART

SEMICONDUCTOR DEVICE AND SEMICONDUCTOR INTEGRATED CIRCUIT DEVICE

This application is based on Japanese patent application NO.2003-376664, the content of which is incorporated herein by reference.

BACKGROUND OF THE INVENTION

1. Field of the Invention

The present invention relates to a semiconductor device and a semiconductor integrated circuit device.

2. Related Art

In modern large scale semiconductor integrated circuit devices (hereinafter referred to as "LSIs"), a scale reduction of node diffusion layers of memory cells is achieved by miniaturization and/or reducing operating voltage, and the resistance to the soft-error problem, in which the information accumulated in the node diffusion layer is typically inverted, becomes a problem. It is known that electron-positive hole pairs are generated in the substrate by alpha particles or cosmic ray-origin neutrons generated from a package or a wiring material of a LSI, and a few carriers flow into the node diffusion layer to change the electric potential of the diffusion layer, thereby causing the soft-error. Further, since secondary ion generated by a nuclear reaction (nuclear crushing reaction) of neutron and silicon helps generating about 10-folds electron-positive hole pairs in comparison with the case of alpha particles, the soft error, which may induce the electric potential inversion of the general logic circuit in addition to memory cell, may be caused.

Countermeasures for such soft-error are known, such as increasing the node capacity of the memory cell as described later, or providing a barrier layer such as, for example, deep N wells enclosing a P well, which isolates the substrate surface from the substrate body, in order to avoid introducing carriers generated by the radioactive ray into the node diffusion layer.

On the other hand, in certain types of devices such as SRAM cell, the PN isolation spacing is reduced due to the miniaturization to provide larger capacity of the parasitic bipolar transistor, and thus there is a room of improving the latch-up resistance. Although the latch-up resistance in the conventional technology caused by the source voltage-originated trigger (trigger of the break-down of the PN junction or the break-down between SDs of a MOSFET) is gradually improved by lowering the operating voltage of the LSI in recent years, there is still a room for further improving other problems such as external noise and the like.

As countermeasures for the latch-up problems, technologies of reducing resistance of well/substrate (for example, providing a retrograde well or a lower resistance substrate) or providing dense number of the contacts for well electric potential and substrate electric potential, are known.

In such circumstances, a technology for simultaneously improving the soft-error resistance and the latch up resistance is disclosed in Japanese Patent Laid-Open No. JP-A-H10-70250 (1999), in which a lower concentration impurity layer is formed on an underlying layer of well formed on the principal surface of a semiconductor substrate and the impurity profile of the well/low concentration impurity layer/substrate is optimized. Another technology of changing the impurity density in a well of a semiconductor device having triple-well structure according to the required function is disclosed in Japanese Patent Laid-Open No. JP-A-2001-291779. Although these technologies are effective in solving the soft-error and latch-up problems by optimizing the nature of the substrate/well impurity, there is no description therein on how the electric potential of the substrate/well is drawn, and thus there is still a room for further providing an improvement in view of the latch-up resistance.

On the other hand, Japanese Patent Laid-Open No. JP-A-2003-60071 discloses a technology, in which a soft-error is prevented by providing a deep well layer (buried layer) as an interlayer under the N well/P well, which are formed on the semiconductor substrate. FIGS. 8A and 8B are figures for describing this type of technology, in which FIG. 8A is a plan view, and FIG., 8B is a schematic cross-sectional view along line E—E. Further, an enlarged cross-sectional view of the portion along line F—F of FIG. 8A is shown in FIG. 9. In these figures, MCs, which are sectioned by chain lines in FIG. 8A, is a 1-bit area of CMOS type SRAM cells, and P wells 202 and N wells 203 are provided on the silicon substrate 201. Gate electrodes 209 of NMOSFET and PMOSFET, which compose SRAM cell, are respectively formed on these wells, and both of the N+ diffusion layer 208 and the P+ diffusion layer 207 are formed in each well. Here, the gate electrodes 209 are not shown in FIG. 8B. Buried N wells 206 are formed over the entire surface of the layer underlying the aforementioned P well 202 and the N well 203. Further, a P+ diffusion layer 212 of the P well electric potential junction 204 is disposed for the aforementioned P well 202, and a N+ diffusion layer 213 of the N well electric potential junction 205 is disposed for the aforementioned N well 203. Here, the numeral number 214 indicates an interlayer insulating film, 215 indicates a contact electrode and 216 indicates a metal line. In such configuration, introduction of minor carriers generated in the substrate into each of the diffusion layers 207 and 208 of memory cells is inhibited by comprising the buried N well 206, thereby improving the soft-error resistance.

However, since such configuration provides electric connections for the P wells 202 by disposing P well electric potential junction 204 in every several memory cells (every bit), effective resistances of the P wells 202 is increased, and thus it is subjected to provide insufficient constitution in view of the latch-up resistance. Thus, in Japanese Patent Laid-Open No. JP-A-2003-60071, a buried P well is formed (not shown) between the P well 202 and N well 203 and the buried N well 206 disposed underlying thereof, and power feeding to the P well is conducted through the buried P well. Therefore, such configuration reduces the effective resistance of the P well, and thus is effective in improving with latch-up resistance. Nevertheless, providing the buried P well promotes a difficulty in escaping electron generated in the P well toward the direction to the deep portion of the substrate, and in this respect, an advantageous effect obtained by the countermeasures for the soft-error problem, in which the number of electric charge collected to the node diffusion layer is diminished, is adversely reduced.

On the other hand, U.S. Pat. No. 6,472,715 discloses technologies for improving the soft-error resistance by forming N well, which is adjacent to P well, to a deep region of the substrate, or alternatively by composing the deep N well that is a type of a N well, a lower region of which is extended to a lower region of the P well. Although there is no description on the latch-up countermeasures in this technology, it is presumed that the structure thereof is that the P well is partially in contact with the P-type substrate, and, in turn, the electric potential of the P well is also supplied from the substrate, resulting in improving the latch-up resistance.

However, the improvement may be difficult in the structure such as memory cell, in which the MOSFETs are packed therein in the example of the disclosed technology, due to the transverse diffusion caused during the high-energy ion implantation. Further, in all the prior art disclosures listed above, there is no description on the optimization of substrate/well structure for the purpose of providing countermeasures for the soft-error of peripheral circuit (logic circuits except memory cell).

Here, it is generally known that the silicon-on-insulator (SOI) structure simultaneously provides improvements in both the soft-error resistance and the latch-up resistance. However, it is difficult to adopt the SOI substrate to the commercial production, because of the higher price of the SOI substrate, the difficulty in decreasing the size of the memory cell due to the necessity for the body contact in order to inhibit the operation of the parasitic bipolar device, the problems on the manufacturing process specified to the SOI substrate (e.g., silicidation is difficult) or the like.

It has now been discovered that, in the conventional LSI, when the impurity-containing layer is formed on the layer underlying the well to completely isolate the well from the substrate, resulting in improving the soft-error resistance, the trade-off is that the latch-up countermeasure easily becomes to be insufficient, since the manner of drawing the well electric potential/substrate electric potential is not optimum. On the other hand, when the well is partially in contact with the substrate to improve the latch-up resistance, insufficient countermeasures for the soft-error is provided since insufficient isolation of the well is provided.

SUMMARY OF THE INVENTION

According to the present invention, there is provided a semiconductor device, comprising: a semiconductor substrate of a single conductivity type; a first region of a single conductivity type, being provided on a side of an element formation surface of the semiconductor substrate; a second region of an inverse conductivity type, being provided on the side of the element formation surface of the semiconductor substrate; a first transistor provided on the first region; a second transistor provided on the second region; a terminal provided on the side of the element formation surface of the semiconductor substrate; a contact provided on a side that is more close to the element formation surface than the first region, the contact coupling the terminal and the first region; and a third region of an inverse conductivity type, the third region being provided between a part of a bottom of the first region and an entire bottom of the second region and a side of the bottom surface of the semiconductor substrate, wherein the first region and the side of the bottom surface of the semiconductor substrate is capable of being electrically coupled.

In the device thus constructed, in light of the soft-error countermeasures, the configuration of providing the third region of the inverse conductivity type on the layer underlying the first region of a single conductivity type can reduce electrons or carriers collected by the first transistor in the first region of the single conductivity type. When the entire bottom of the first region of the single conductivity type is enclosed by the third region of the inverse conductivity type, the resistance of the first region of the single conductivity type is apt to be increased. To address the problem, the semiconductor substrate of a single conductivity type is employed, and a clearance of a single conductivity type is provided under the lower part of the contact that is provided for coupling the terminal to the first region to electrically couple the first region of single conductivity type to the bottom surface side of the semiconductor substrate of the single conductivity type, thereby providing an improvement in the latch-up resistance. Thus, according to this type of configuration, the semiconductor device exhibiting better balance of the soft-error resistance and the latch-up resistance is provided.

Here, it is assumed that the side of the bottom surface of the semiconductor substrate is a region of a single conductivity type beneath the third region of the substrate in the present invention. Here, it is assumed that the semiconductor device contains the semiconductor integrated circuit device in the present invention.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE PREFERRED EMBODIMENTS

LSI in the present invention is applied to types of LSI including a memory cell of SRAM, which is composed of MOS transistor of first conductivity type channel and MOS transistor of second conductivity type channel. In this case, electrical coupling region for coupling the electric potential of the well of the first conductivity type to a predetermined electric potential may preferably be disposed in the cell array of a plurality of aforementioned SRAM memory cells, and may preferably be provided in every one of the predetermined number of the SRAM cells. In addition, the electric potential coupling region for coupling the electric potential of the aforementioned well of the first conductivity type to a predetermined electric potential may preferably be coupled to metal lines having a two-dimensional pattern of a grid-shape. Further, LSI in the present invention may comprise CMOS logic circuit as a peripheral circuit, which is composed by a MOS transistor of the first conductivity type channel and a MOS transistor of the aforementioned second conductivity type channel.

According to the best mode of LSI of the present invention, in a CMOS type SRAM memory cell, which involves the severest countermeasure for the latch-up problem, improvement of the latch-up resistance is achieved by coupling the P wells to the lower resistor substrate at an interval of every predetermined cells. Further, the electric potential of the P well is coupled thereto via metallic lines in a grid manner to stabilize the substrate electric potential in the cell array, thereby further reducing the resistance of the P well (effective resistance) to achieve the improvement in the latch-up resistance.

First Embodiment

Figure 1A:
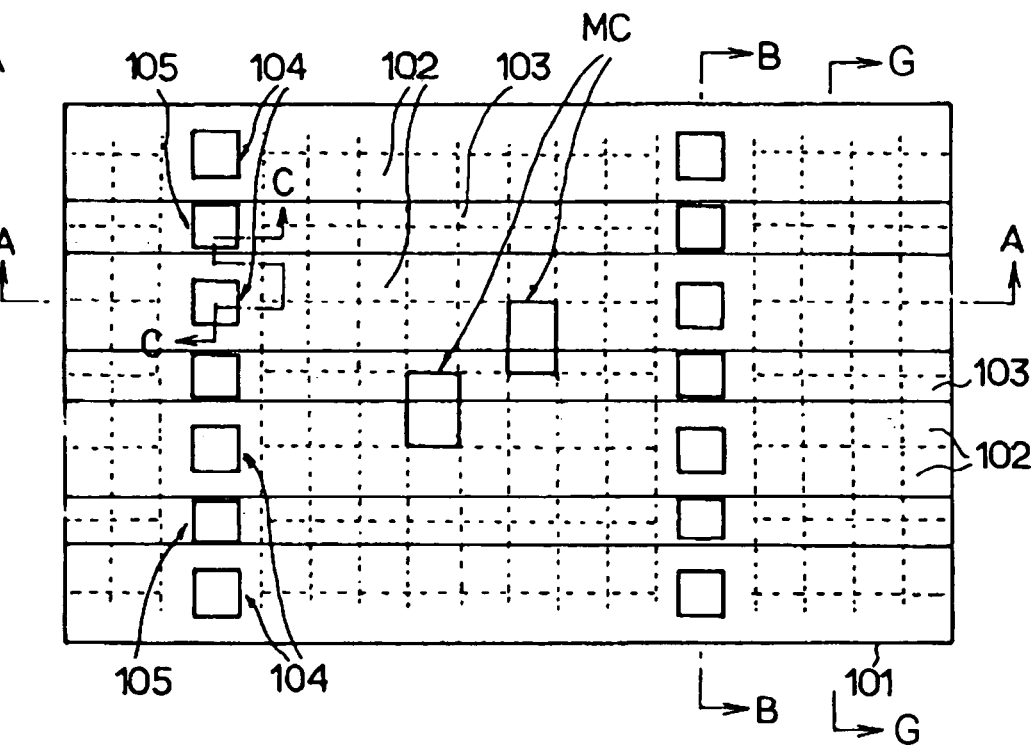
FIG. 1A is a schematic plan view of a cell array comprising a plurality of CMOS type SRAM cells.
Figure 1B:
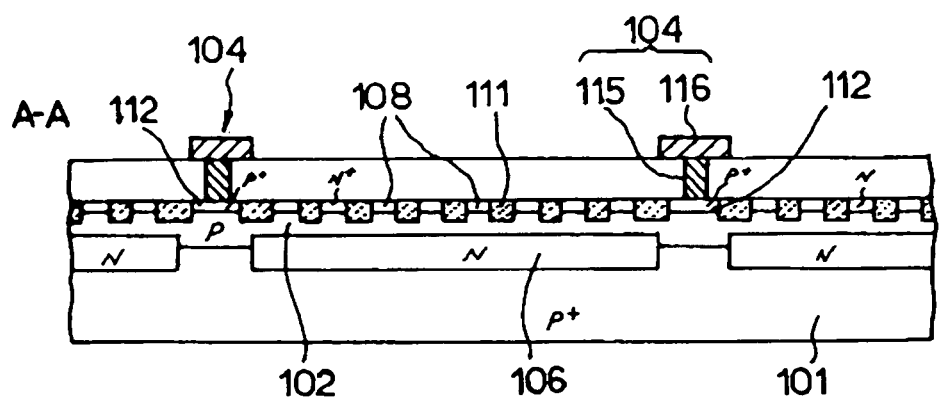
FIG. 1B and FIG. 1C are cross-sectional views of the cell array shown in of FIG. 1A, cut along line A—A and line B—B, respectively.
Figure 1C:
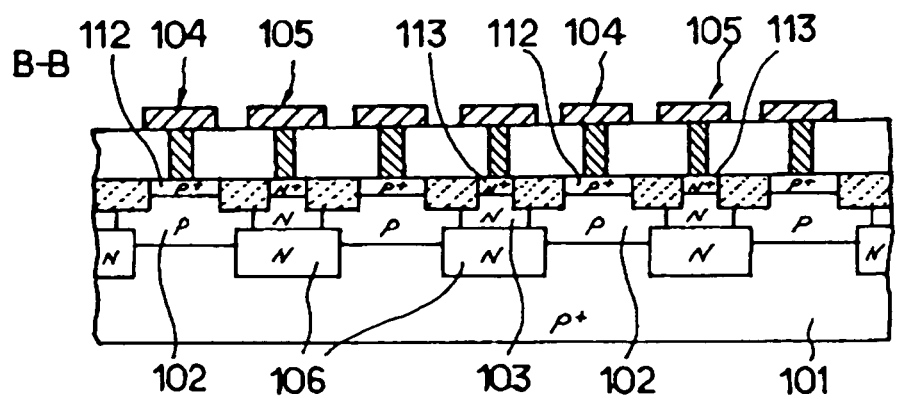

Embodiments of the present invention will be described as follows, in reference with the annexed figures. FIG. 1A is a schematic plan view of a cell array comprising a plurality of CMOS type SRAM cells. FIG. 1B and FIG. 1C are cross-sectional views cut along line A—A and line B—B of FIG. 1A, respectively. In FIG. 1A, a CMOS type SRAM cell portion includes a NMOSFET (N-channel type MOS field effect transistor), which is not shown and disposed in a region of a P well 102, and a PMOSFET (P-channel type MOS field effect transistor), which is not also shown and disposed in a region of a N well 103, and the PMOSFET and the NMOSFET are electrically coupled to form a memory cell "MC". Here, since the configuration of the memory cell itself is identical to that having the circuit structure conventionally provided, the detailed description thereof is omitted. The aforementioned P wells 102 and N wells 103 are alternately disposed in a band-like manner to form one (1 bit) memory cell "MC" in each of the regions of the N wells 103 and the P wells 102, as shown by the bold line enclosing a part of the section indicated by the broken line in these figures. Further, one P well electric potential junction 104 is provided in every 8 memory cells (i.e., 8 cells or 8 bits are interposed therebetween) along the X direction (transverse direction) of the array of the aforementioned P wells 102, and the N well electric potential junctions 105 are disposed between the aforementioned P well electric potential junctions 104 on the N well 103 along the Y direction (longitudinal direction).

In FIGS. 1B and 1C, the substrate 101 is composed as a P on P+ substrate (P+ region is the side of the bottom surface of said semiconductor substrate 101). This P on P+ substrate 101 is composed of a lower resistance region in the lower region (P-type higher concentration-impurity region) and a higher resistance region near the surface (P-type lower concentration-impurity region).

Although the details of the P on P+ substrate 101 itself is not described here, the resistivity of the lower resistance region may generally be about 0.1 to 0.001 Ω-cm, and the resistivity of the higher resistance region in the upper portion may be about 1 to several tens Ω-cm, and the thickness of the higher resistance region may be about several μm. These figures show that the NMOSFET and the PMOSFET are respectively formed on the aforementioned P well 102 and N well 103, and such configuration is also shown in FIG. 2, and the description thereof is omitted here. The configuration is that buried (deep) N wells 106 containing impurities that have been ion-implanted into deeper level are formed on the layer underlying the aforementioned P wells 102 and N wells 103, and on the other hand there is no buried N well 106 directly under the aforementioned P well electric potential junction 104. In other words, the region being disposed directly under the P well electric potential junction 104 and having no buried N well 106 forms one type of P-type contact, and couples the P well 102 to the P type region disposed at the side of the bottom surface of the P on P+ substrate 101. Further, the buried N well 106 isolates a part of the P well 102 and the N well 103 from the P-type region disposed on the side of the bottom surface of the P on P+ substrate 101.

Figure 2A:
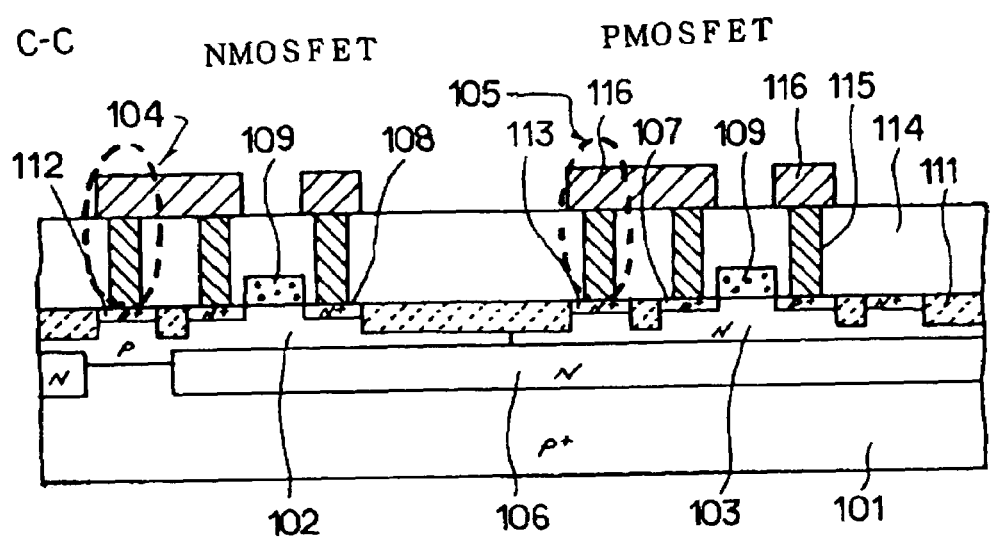
FIG. 2A is an enlarged cross-sectional view of the cell array shown in FIG. 1A, cut along line C—C.

More specifically, as shown in FIG. 2A, which is an enlarged cross-sectional view cut along line C—C of FIG. 1A, an element isolation insulating film 111 is formed in each region of the aforementioned P well 102 and N well 103 or in the boundary region therebetween in the memory cell MC, and the N+ diffusion layer 108 is formed on the principal surface of the P well 102, and a gate electrode 100 is additionally included to compose the aforementioned NMOSFET.

Figure 2B:
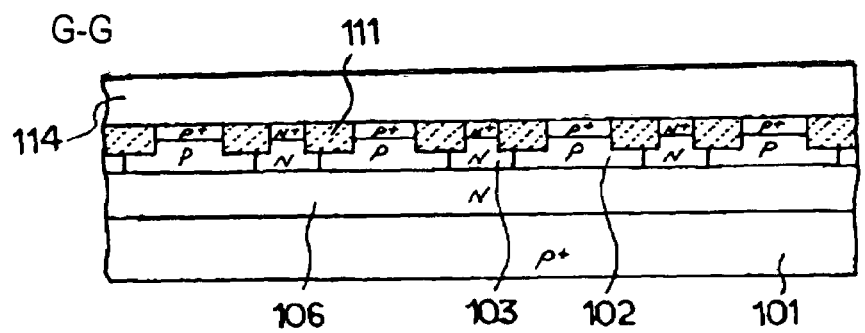
FIG. 2B is an enlarged cross-sectional view of the cell array shown in FIG. 1A, cut along line G—G.
Figure 2C:
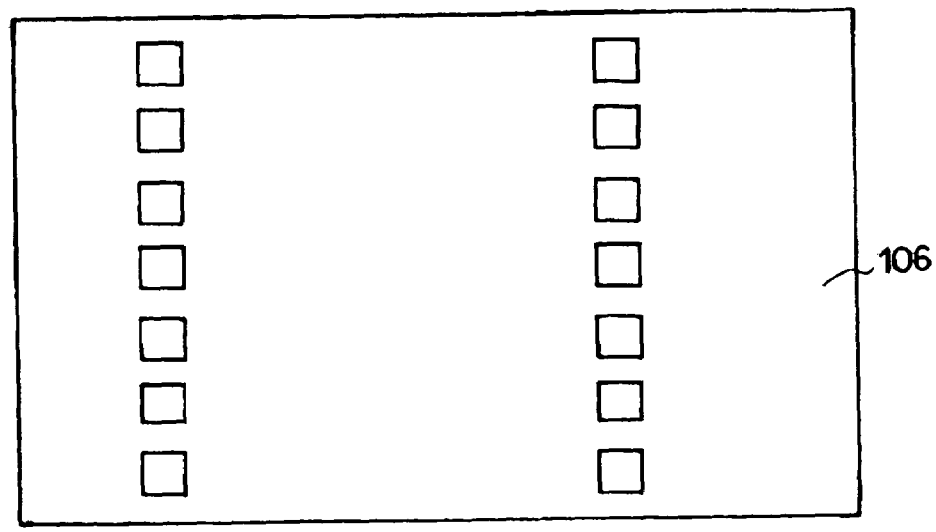
FIG. 2C is a schematic plan view of a buried N well.

Similarly, P+ diffusion layer 107 is formed on the principal surface of the N well 103, and a gate electrode 109 is additionally included to compose the aforementioned PMOSFET. On the contrary, as shown in FIG. 2B and FIG. 2C, which are an enlarged cross-sectional view of the cell array shown in FIG. 1A, cut along line G—G and a schematic plan view of a buried N well, P+ diffusion layer 112 for the contact is formed on the principal surface of the aforementioned P well 102 of the aforementioned P well electric potential junction 104, though the aforementioned buried N well 106 does not exist in the part of the region directly under thereof. On the other hand, N+ diffusion layer 113 for the contact is formed on the principal surface of the aforementioned N well 103 of aforementioned N well electric potential junction 105, and the aforementioned buried N well 106 is formed directly under thereof.

In addition, an interlayer insulating film 114 is formed on the surface of the aforementioned substrate 101; contact holes are opened in the interlayer insulating film 114; and contact electrodes 115 are formed, which are respectively coupled to a P+ diffusion layer 112 of the aforementioned P well electric potential junction 104, a N+ diffusion layer 113 of aforementioned N well electric potential junction 105 and respective P+ diffusion layers 107 and N+ diffusion layers 108 of the aforementioned PMOSFET and NMOSFET. The electric coupling for these contact electrodes 115 are conducted via metal lines 116 formed on the aforementioned interlayer insulating film 114. In other words, the metal line 116 on the interlayer insulating film 114 is a type of the-terminal that couples to the electrodes 115.

Figure 3A:
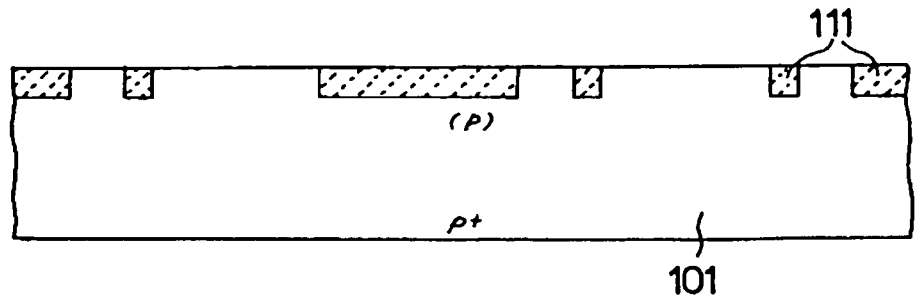
FIGS. 3A to 3D are cross-sectional views of the cell array, showing main processes of the manufacturing process of LSI shown in FIGS. 1A to 1C and FIG. 2.
Figure 3B:
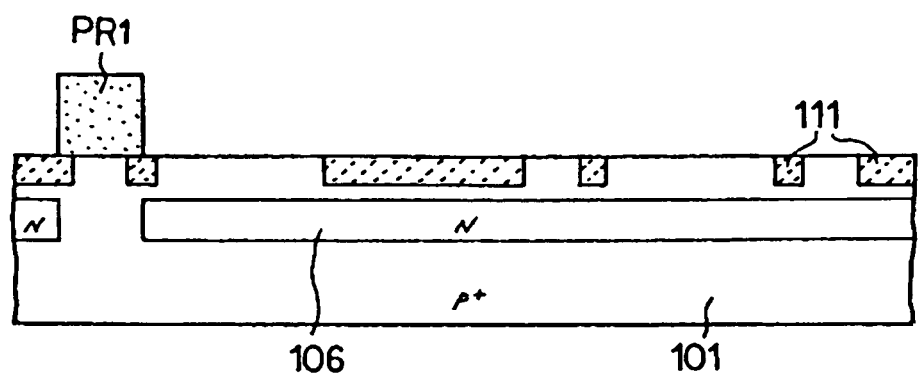
Figure 3C:
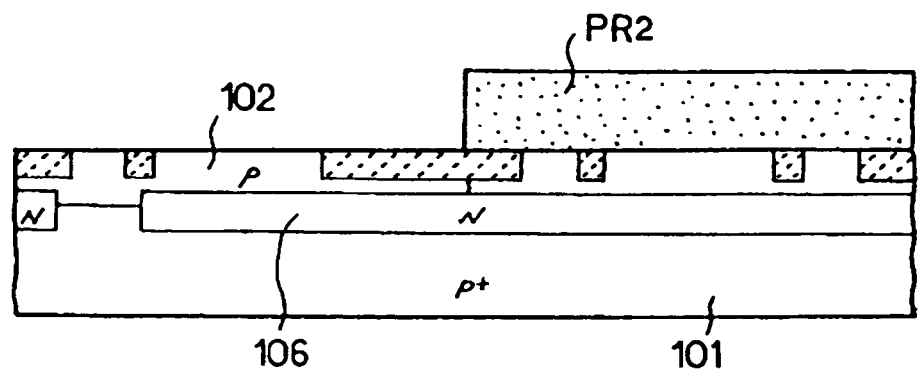
Figure 3D:
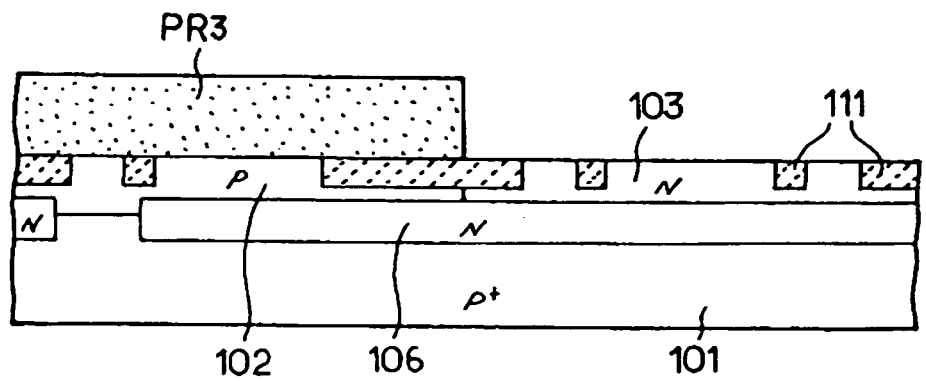

FIGS. 3A to 3D and FIGS. 4A to 4C are cross-sectional views showing main processes of the manufacturing process of LSI shown in FIGS. 1A to 1C and FIG. 2. First, as shown in FIG. 3A, a predetermined element isolation region 111 is formed on the surface of the P on P+ substrate 101. The element isolation region 111 is formed by, for example, forming a shallow trench on a predetermined region of the surface of the P on P+ substrate 101 through a mask (not shown); filling the trench with an insulating material or forming an insulating film on the inside surface of the trench; and thereafter filling the various material to form a shallow trench isolation (STI). Then, as shown in FIG. 3B, buried N well 106 is formed through a photo resist mask PR1. In such case, the buried N well 106 can be formed in the region, on which the aforementioned photo resist mask PR1 is not disposed, at a predetermined depth in the P on P+ substrate 101, by selectively forming the photo resist mask PR1 on a region that will become the P well electric potential junction 104, and injecting N-type impurity at a predetermined higher density and energy onto the surface of P on P+ substrate 101. Then, as shown in FIG. 3C, P-type impurity is injected into the region, on which a NMOSFET is to be formed, through a photo resist mask PR2 to form the P well 102 on the buried N well 106. Consequently, as shown in FIG. 3C, N-type impurity is injected into the region, on which a PMOSFET is to be formed, through a photo resist mask PR3 to form the N well 103 on the buried N well 106.

Figure 4A:
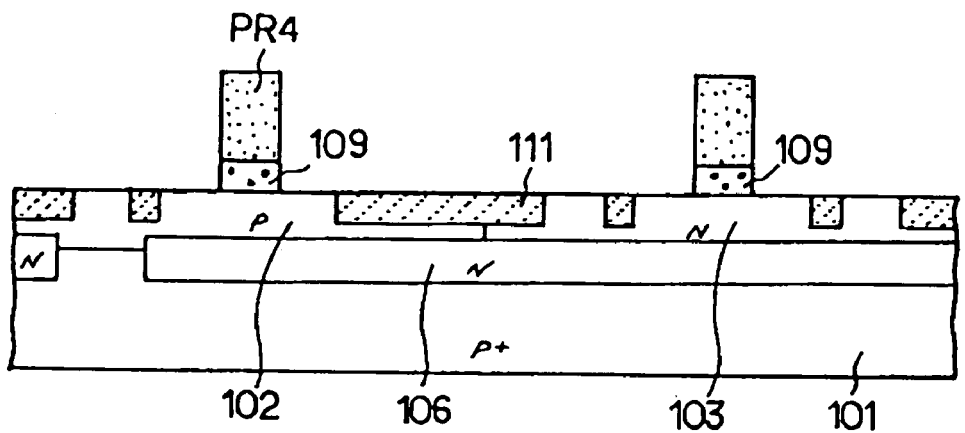
FIGS. 4A to 4C are cross-sectional views of the cell array, showing main processes of the manufacturing process of LSI shown in FIGS. 1A to 1C and FIG. 2.
Figure 4B:
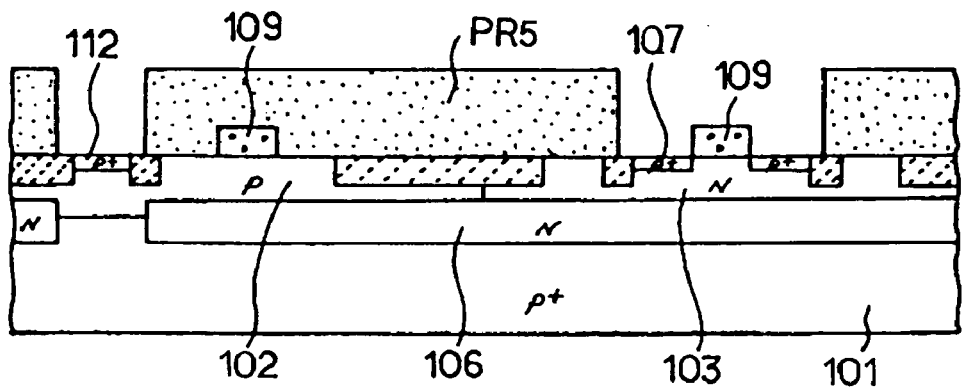
Figure 4C:
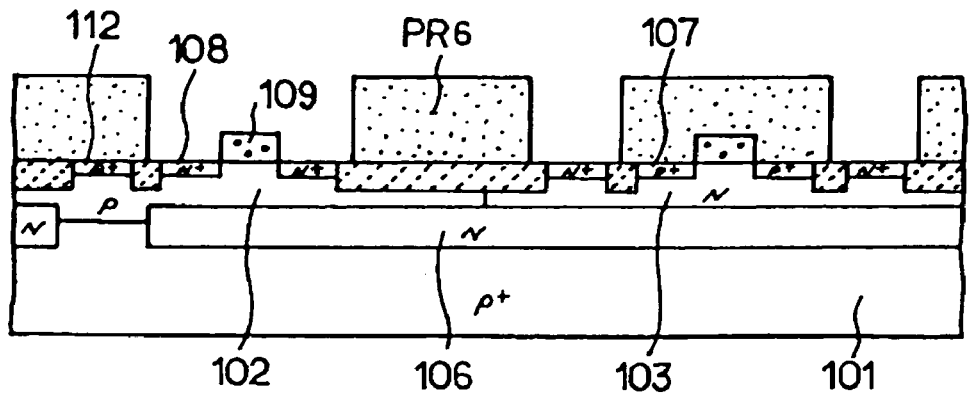

Further, as shown in FIG. 4A, a polysilicon film is formed, and the formed film is selectively etched through the photo resist mask PR4 to form gate electrodes 109 of the NMOSFET and the PMOSFET. Then, as shown in FIG. 4B, the region for forming the NMOSFET is coated with photo resist mask PR5, and a P-type impurity is ion-implanted to form the P+ diffusion layer 107 as source/drain of the PMOSFET. In this case, the P+ diffusion layer 112 is also formed in the P well electric potential junction 104. Similarly, as shown in FIG. 4C, the region for forming the PMOSFET is coated with photo resist mask PR6, and the N+ diffusion layer 108 as source/drain of the NMOSFET and the N+ diffusion layer 113 of the N well electric potential junction 105 are formed. Thereafter, as shown in FIG. 2, the interlayer insulating film 114, the contact electrode 115 and the metal lines 116 are formed by employing a known manufacturing method to form the aforementioned cell array.

In this embodiment configured as described above, layers disposed under the N+ diffusion layer 108, which is to be a node diffusion layer of a NMOSFET in the memory cell are, from the top in sequence: the P well 102; the buriedN well 106; and the P on P+ substrate 101. Thus, since a portion of the electrons among the electrons/positive holes generated in the P well 102 by radioactive ray pass therethrough toward the side of the buried N well 106, number of electrons entering into the N+ diffusion layer (node diffusion layer) 108 is decreased. In addition, since electrons generated in the buried N well 106 and the P on P+ substrate 101 do not enter into the P well 102, electrons does not enter into the N+ diffusion layer (node diffusion layer) 108. Thus, the soft-error resistance is improved in comparison with the configuration of free of the buried N well 106. At the same time, in view of the improvement in the latch-up resistance, the device employs the configuration of employing the P on P+ substrate 101 instead of the general P substrate and the configuration, in which P wells 102 couple at every fixed interval (8 bits are interposed therebetween in FIG. 1A) to the P on P+ substrate 101 on the regions of P well electric potential junction 104 where the buried N well 106 is not disposed, and thus the resistance of the P well 102 can be decreased, thereby providing improved latch-up resistance.

Although positive holes may enter into the P+ diffusion layer (node diffusion layer) 107 of the PMOSFET to possibly cause the soft-error, the soft error is hardly caused in reality, since the mobility of positive hole is lower than that of electron and the area of the P+ diffusion layer (node diffusion layer) 107 of the PMOSFET is small. Further, the existence of the buried N well 106 under the portion of N well 103, on which the PMOSFET is formed, may slightly reduce the resistance of the N well, as compared with the case of the N well 103 having no buried N well 106, thereby providing an improvement in the latch-up resistance.

Figure 5:
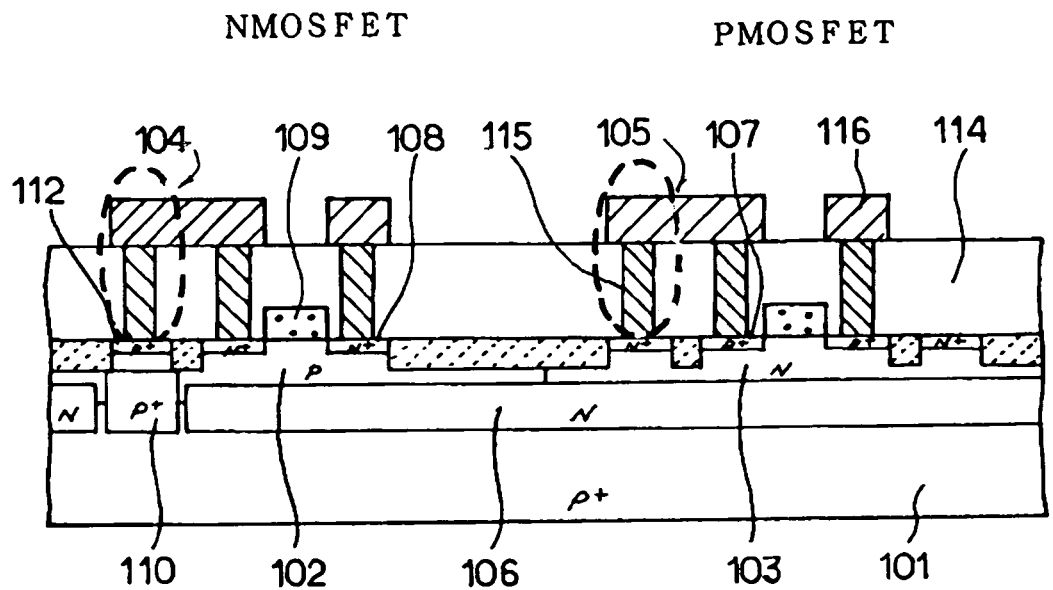
FIG. 5 is a cross-sectional view of the cell array, showing a modification of first embodiment.
Figure 6:
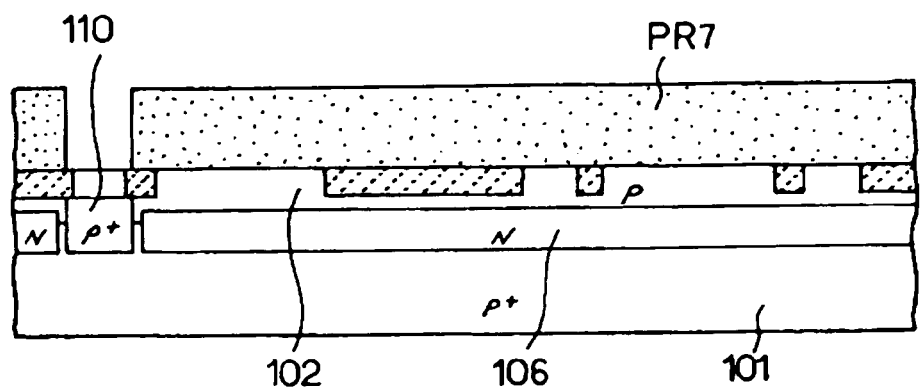
FIG. 6 is a cross-sectional view of the cell array, showing a manufacturing process for the modification of first embodiment.

In this embodiment, as shown in FIG. 5, the buried P+ diffusion layer 110 may be formed from a bottom in the P well 102 of the P well electric potential junction 104 into a depth region of reaching the P+ region of the P on P+ substrate 101. The coupling resistance of between the P well 102 and the P on P+ substrate 101 can be reduced by forming such buried P+ diffusion layer 110, and, in turn, the effective resistance of the P well 102 can also be reduced to further improve the latch-up resistance. Here, the buried P+ diffusion layer 110 can be formed by, after the manufacturing process step illustrated in FIG. 3B, forming photo resist mask PR7 having only an opening of the P well electric potential junction 104, and implanting higher concentration of a P-type impurity at a predetermined implant energy into the P on P+ substrate 101, as shown in FIG. 6.

In addition, concerning the metal lines 116 of the P well electric potential junction 104 or the metal lines 116 of the N well electric potential junction 105, when at least either one of the electric potential junctions are respectively coupled to form a grid-shape, further stabilization of electric potential can be achieved, and the latch-up, resistance is improved, though it is not shown in these figures.

Here, in order to contain no buried N well 106 direct under the P well electric potential junction 104 of the memory cell array, if there is not a certain level of the region dimension (according to the conditions for forming the buried N wells), the buried N wells 106 may be coupled in their completion, and thus in order to reduce the dimension of the P well electric potential junction 104, the mask position for the buried N well 106 may preferably be shifted in advance as required, so that the position of the completed element is at the memory cell boundary region (more exactly, the necessary position that helps preventing the soft error)

Second Embodiment

Figure 7A:
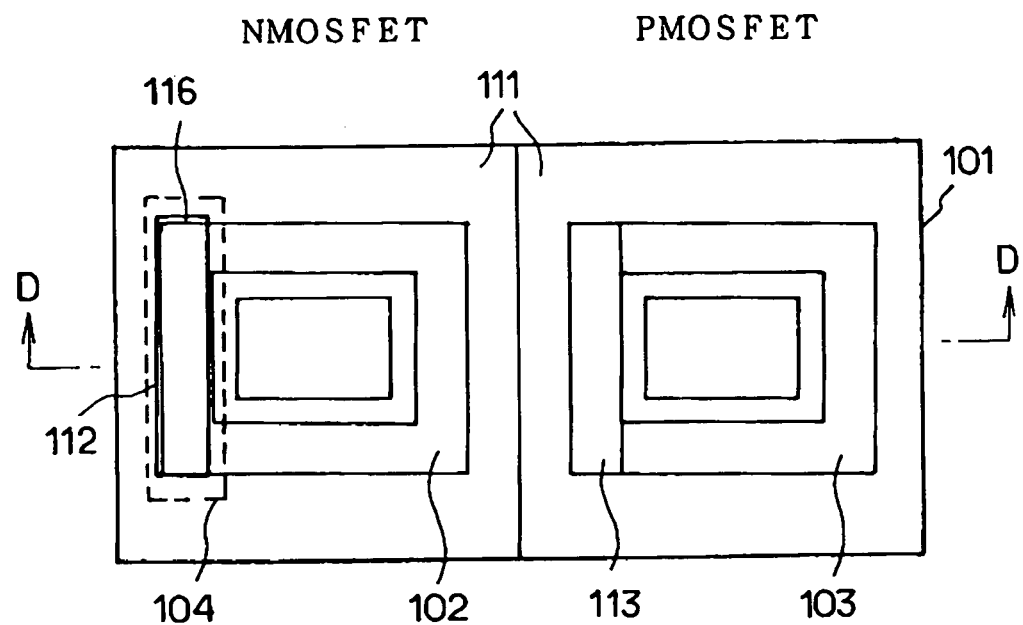
FIG. 7A is a plan view of the main part of the structure illustrated in second embodiment.
Figure 7B:
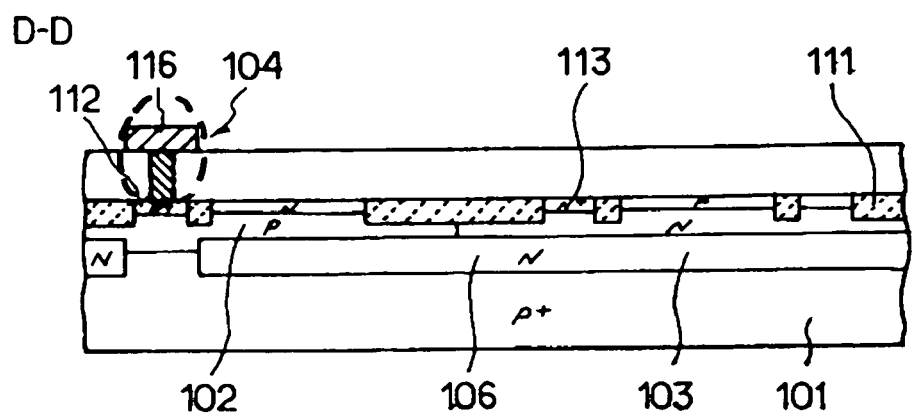
FIG. 7B is a cross-sectional view of the structure shown in FIG. 7A along line D—D.
Figure 8A:
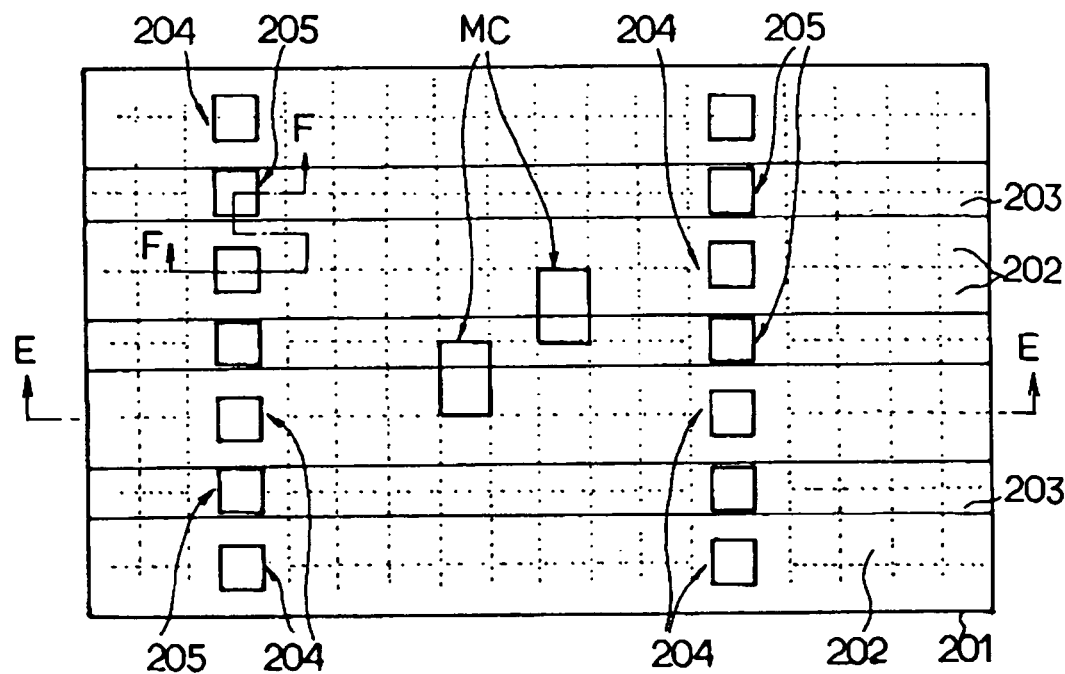
FIG. 8A is a plan view of a conventional LSI, and FIG., 8B is a schematic cross-sectional view cut along line E—E.
Figure 8B:
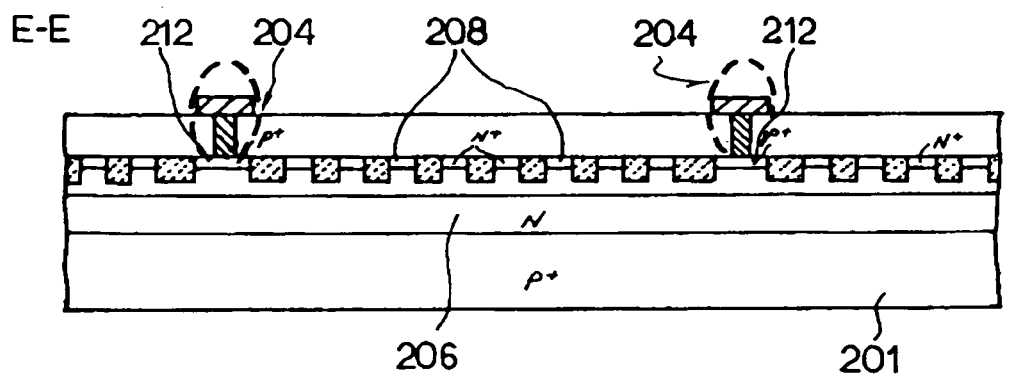
Figure 9:
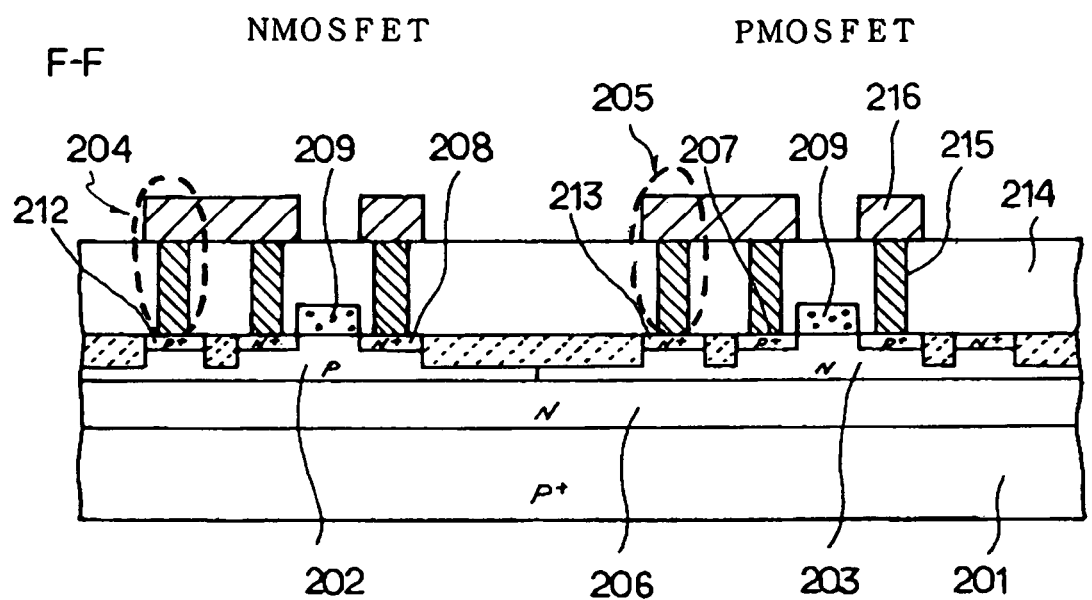
FIG. 9 is an enlarged cross-sectional view of the portion cut along line F—F of FIG. 8A.

The present invention is not only applicable to the memory cells as illustrated in first embodiment, but can also be applicable to peripheral circuits of LSI (usual CMOS logic circuits). FIG. 7A is a plan view of the main part of the structure illustrated in second embodiment, in which the present invention is applied to the peripheral circuits, and FIG. 7B is a cross-sectional view of the structure shown in FIG. 7A along line D—D, and the same numeral number is assigned to the equivalent element appeared in first embodiment. NMOSFET and PMOSFET are formed in the P well 102 and the N well 103 formed in the P on P+ substrate 101, respectively. In addition, a buried N well 106 is provided in layer under the aforementioned P well 102 and N well 103 in the aforementioned P on P+ substrate 101. In addition, the P well electric potential junction 104 for providing the substrate electric potential of the NMOSFET, or in other words the predetermined electric potential of the P well 102 has a portion of free of the aforementioned buried N well 106, and the P well 102 is coupled to the P on P+ substrate 101. The P well electric potential junction 104 is shown as a region enclosed by lines forming a rectangle in FIG. 7A.

In the second embodiment, since P well electric potential is also supplied through the P on P+ substrate 101, drifting of the electric potential of the P well 102 at the time of generating noise (potential is increased, in view of the latch-up problem) can be inhibited. In addition, the soft error in the peripheral circuits (in this case, provided as the inversion of logic level) can also be prevented, due to the existence of the buried N well 106. In particular, the configuration provides the advantageous effect of inhibiting the soft-error caused by larger quantity of electrons/positive holes that are created by secondary ions generated by a nuclear reaction of neutron with silicon.

It should be understood that the present invention is not limited to the above-described First and second embodiment, and the present invention can be equivalently applied to other configurations, provided that the LSI comprises a circuit having CMOS structure and the LSI comprises a circuit, for which soft-error and latch-up are problem.

According to another aspect of the semiconductor device of the present invention, there is provided a LSI, comprising: a well of a first conductivity type and a well of a second conductivity type, both being formed in vicinity of a surface of a first conductivity type substrate having a higher concentration-impurity region in a lower portion thereof; and a MOS transistor of the second conductivity type channel and a MOS transistor of the first conductivity type channel, being formed in the both wells, respectively, wherein buried wells of the second conductivity type is formed across regions directly under the both wells, and wherein a region, which is free of the buried well of the second conductivity type, is provided in an electric potential coupling region for coupling the well of the first conductivity type to a predetermined electric potential. In this aspect of the LSI of the present invention, it may be preferable to further comprise a buried diffusion layer of the first conductivity type and high density, the buried diffusion layer having a depth of reaching a higher concentration-impurity region of the first conductivity type substrate in the region, which is free of the buried well of the second conductivity type.

According to an aspect of the method for manufacturing the semiconductor device of the present invention, there is provided a method, comprising:

forming an element isolation region on a surface of a first conductivity type substrate having a higher concentration-impurity region in a lower portion thereof;

forming a buried well of a second conductivity type at a deep position of predetermined region of the substrate;

forming a well of the first conductivity type and well of the second conductivity type in an upper layer of inside and outside regions of the buried well; and respectively forming a MOS transistor of a second conductivity type channel and a MOS transistor of a first conductivity type channel in each of the wells, wherein a part of well of the first conductivity type is formed in the region where the buried well is not disposed, during the forming of the well of the first conductivity type. In addition, it is preferable that the method further comprises introducing an impurity of the first conductivity type into the well of the first conductivity type in the region where the buried well is not disposed to form a buried diffusion layer of the first conductivity type that reaches a higher concentration-impurity region of the substrate.

According to the LSI of the present invention, in light of the soft-error countermeasures, the configuration of having the buried well of the second conductivity type (i.e., buried N well) provided in the layer underlying the well of the first conductivity type (i.e., P well) reduces electrons collected by the N+ diffusion layer of the NMOSFET in the P well (i.e., electrons generated by radioactive rays). Although the resistance of the P well is increased when the P well is enclosed with the buried N wells, the latch-up resistance can be improved by employing the P on P+ substrate having lower resistance as the substrate thereof, and by further achieving the electrical coupling to the low resistance substrate at a point for drawing the electric potential of the P well without the existence of the buried N well. In particular, by forming the buried diffusion layer in the P well for coupling the P well to the P on P+ substrate, the resistance between the P well and the substrate can be reduced, and thus the latch up resistance is improved.

The method for manufacturing LSI according to the present invention provides manufacturing a LSI comprising memory cell of CMOS structure and a peripheral circuits, which involves improved soft-error resistance and improved latch up resistance.

To summarize the present invention again, the following descriptions are provided.

According to the present invention, there is provided a method for manufacturing a semiconductor device, comprising:

forming an element isolation region on a side of the element formation surface of a single conductivity type semiconductor substrate;

forming a third region of an inverse conductivity type having a single conductivity type clearance within the interior of the semiconductor substrate, the single conductivity type clearance electrically coupling a side of the element formation surface of the semiconductor substrate and the side of the bottom surface having a single conductivity type, the side of the element formation surface having a single conductivity type;

forming a first region in a portion of a region directly above the third region and a region directly above the clearance, the first region having a single conductivity type;

forming a second region of an inverse conductivity type in a portion of a region directly above the third region;

forming a first transistor on the first region;

forming a second transistor on the second region;

forming a contact in a region disposed at the side closer to the side of the element formation surface of the semiconductor substrate than the first region and directly above the clearance, the contact electrically coupling to the first region; and forming a terminal at the side of the element formation surface of the semiconductor substrate, the terminal coupling to the contact.

According to this method, in light of the soft-error countermeasures, the formation of the third region of the inverse conductivity type in the layer underlying the first region of the single conductivity type can reduce electrons or carriers collected by the first transistor in the first region of the single conductivity type. In addition, when the entire bottom of the first region of the single conductivity type is enclosed by the third region of the inverse conductivity type, resistance of the first region of single conductivity type is apt to be increased. To address the problem, the semiconductor substrate of a single conductivity type is employed, and a clearance of a single conductivity type is provided to electrically couple the first region of single conductivity type with the side of the bottom surface of the semiconductor substrate of single conductivity-type, and the contact that is provided to couple the terminal with the first region is provided, thereby improving the latch-up resistance. Thus, according to this type of configuration, the semiconductor device having better balance of the soft-error resistance and the latch-up resistance is provided.

In addition, the method for manufacturing the semiconductor device of the present invention may further comprises forming a fourth region in a clearance, the fourth region containing higher concentration of an impurity of a single conductivity type than that in the first region and in the side of the bottom surface of the semiconductor substrate.

In addition, in the method for manufacturing the semiconductor device of the present invention, the forming the above-described first region may further include forming in the portion of coupling to the contact in first region, a portion, in which the concentration of the impurity of the single conductivity type is higher than that in the other regions of the first region.

According to the present invention, there is provided a method for manufacturing a semiconductor device, comprising:
forming an element isolation region on a surface of a first conductivity type substrate having a higher concentration-impurity region in a lower portion thereof; forming a buried well of a second conductivity type at a deep position of a predetermined region of the substrate; forming a well of the first conductivity type and well of the second conductivity type in an upper layer of inside and outside regions of the buried well; and respectively forming a MOS transistor of the second conductivity type channel and a MOS transistor of the first conductivity type channel in each of the wells, wherein a part of the well of the first conductivity type is formed in the region where the buried well is not disposed, during the forming the well of the first conductivity type.

In addition, the method for manufacturing a semiconductor device according to the present invention may further comprise introducing an impurity of the first conductivity type into the well of the first conductivity type in the region where the buried well is not disposed to form a buried diffusion layer of the first conductivity type that reaches a higher concentration-impurity region of the substrate.

In addition, the method for manufacturing a semiconductor device according to the present invention may further comprise forming a first conductivity type diffusion layer of the MOS transistor of the first conductivity type channel in the well of the first conductivity type in the region where the buried well is not disposed, and simultaneously forming a diffusion layer of the first conductivity type having higher concentration thereof for coupling to an electric potential.

It is apparent that the present invention is not limited to the above embodiment, that may be modified and changed without departing from the scope and spirit of the invention.

What is claimed is:

1. A semiconductor device, comprising:
a semiconductor substrate of a first conductivity type;
a third region of a second conductivity type, being partially provided on said semiconductor substrate;
a first region of the first conductivity type, being provided on said third region and said semiconductor substrate;
a second region of a second conductivity type which is an inverse conductivity type of said first conductivity type, being provided on said third region;
a first transistor provided on said first region;
a second transistor provided on said second region;
a contact provided on said first region; and
a terminal provided on said contact, which provides a voltage to said semiconductor substrate via said contact,
wherein said first region is directly connected with said semiconductor substrate under said contact.

2. The semiconductor device according to claim 1, further comprising a fourth region having higher concentration of an impurity for the first conductivity type than said first region and the side of the bottom surface of said semiconductor substrate, wherein said first region and said semiconductor substrate are electrically coupled via said fourth region.

3. The semiconductor device according to claim 1, wherein said first transistor arid said second transistor compose SRAM cells.

4. The semiconductor device according to claim 3, wherein a plurality of said SRAM cells are provided, and wherein one of said contact is provided in every one of said plurality of SRAM cells.

5. The semiconductor device according to claim 1, further comprising grid-shaped metal lines, said grid-shaped metal lines being provided on the element formation surface of said semiconductor substrate and being coupled to said terminal.

6. The semiconductor device according to claim 1, wherein said first transistor and said second transistor compose a logic circuit.

7. The semiconductor device according to claim 1, wherein a portion of said first region, which is coupled to said contact, has higher concentration of an impurity for the first conductivity type than any other portions of said first region.

8. The semiconductor device according to claim 1, wherein the first transistor comprises a MOS transistor of the first conductivity type channel and the second transistor comprises a MOS transistor of the second conductivity type channel, the first transistor and the second transistor composing SRAM memory cells.

9. The semiconductor device according to claim 8, wherein an electrical coupling region for coupling the electric potential of the well of the first conductivity type to a predetermined electric potential is provided in a cell array of a plurality of said SRAM memory cells and also provided in every predetermined number of SRAM cells.

10. A semiconductor integrated circuit device, comprising:
a well of a first conductivity type and a well of a second conductivity type, both being formed in a vicinity of a surface of a first conductivity type substrate having a higher concentration-impurity region in a lower portion thereof; and
a MOS transistor of the second conductivity type channel and a MOS transistor of the first conductivity type channel, being formed in said both wells, respectively,
wherein buried wells of the second conductivity type are formed across regions directly under said both wells, and wherein a region, which is free of the buried well of said second conductivity type, is provided in an electric potential coupling region for coupling said well of the first conductivity type to a predetermined electric potential.

11. The semiconductor integrated circuit device according to claim 10, further comprising a buried diffusion layer of the first conductivity type and having higher impurity density than an impurity density of the surface of the substrate, said buried diffusion layer having a depth of reaching the higher concentration-impurity region of said first conductivity type substrate in a region of said well of said first conductivity, which is free of the buried well of said second conductivity type.

12. The semiconductor integrated circuit device according to claim 10, wherein a memory cell of a SRAM comprises a MOS transistor of said first conductivity type channel and a MOS transistor of said second conductivity type channel.

13. The semiconductor integrated circuit device according to claim 12, wherein an electrical coupling region for coupling the electric potential of said well of said first conductivity type to a predetermined electric potential is provided in a cell array of said plurality of SRAM memory cells and also provided in every predetermined number of SRAM cells.

14. The semiconductor integrated circuit device according to claim 13, wherein an electric potential coupling region for coupling the electric potential of said well of said first conductivity type to a predetermined electric potential is coupled to metal lines having a two-dimensional pattern of a grid-type.

15. The semiconductor integrated circuit device according to claim 10, wherein a CMOS logic circuit as a peripheral circuit comprises a MOS transistor of said first conductivity type channel and a MOS transistor of said second conductivity type channel.

16. The semiconductor integrated circuit device according to claim 10, wherein a diffusion layer of said first conductivity type, and having a higher impurity density same as an impurity density of a diffusion layer of said MOS transistor of said first conductivity type channel, is formed in an electric potential coupling region for coupling the electric potential of said well of said first conductivity type to a predetermined electric potential.

17. A semiconductor device, comprising:
a semiconductor substrate of a first conductivity type;
a third region of a second conductivity type formed on said semiconductor substrate;
at least two regions of said first conductivity type formed at a predetermined interval in a first direction, each of said regions being penetrating through said third region; and
a plurality of terminals each connecting said semiconductor substrate through a corresponding one of said plurality of regions which are directly electrically connected with said semiconductor substrate.

18. The semiconductor device according to claim 17, further comprising transistors of a first type and a complementary type formed above said third region, said transistors being arranged between adjacent two terminals of said plurality of terminals in said first direction.

19. The semiconductor device according to claim 18, wherein said regions are further formed in a second direction perpendicular to said first direction so that said regions are arranged in a matrix.

* * * * *